United States Patent
La Rosa (10) Patent No.: US 9,543,360 B2
(45) Date of Patent: *Jan. 10, 2017

(54) TAILORABLE FLEXIBLE SHEET OF MONOLITHICALLY FABRICATED ARRAY OF SEPARABLE CELLS EACH COMPRISING A WHOLLY ORGANIC, INTEGRATED CIRCUIT ADAPTED TO PERFORM A SPECIFIC FUNCTION

(71) Applicant: STMICROELECTRONICS S.R.L., Agrate Brianza (IT)

(72) Inventor: Manuela La Rosa, Gravina di Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 190 days.

This patent is subject to a terminal disclaimer.

(21) Appl. No.: 14/305,158

(22) Filed: Jun. 16, 2014

(65) Prior Publication Data

US 2014/0295585 A1 Oct. 2, 2014

Related U.S. Application Data

(62) Division of application No. 13/034,978, filed on Feb. 25, 2011, now Pat. No. 8,830,685.

(30) Foreign Application Priority Data

Feb. 26, 2010 (IT) .......................... VA2010A000018

(51) Int. Cl.
    *H01L 27/30* (2006.01)
    *H01L 27/28* (2006.01)
(52) U.S. Cl.
    CPC ............ *H01L 27/285* (2013.01); *H01L 27/28* (2013.01); *H01L 27/288* (2013.01); *H01L 27/30* (2013.01); *H01L 2251/566* (2013.01)

(58) Field of Classification Search
    None
    See application file for complete search history.

(56) References Cited

U.S. PATENT DOCUMENTS

| 3,775,188 A | 11/1973 | Oltman et al. |
| 5,547,780 A | 8/1996 | Kagawa et al. |

(Continued)

FOREIGN PATENT DOCUMENTS

| CH | 1055256 B1 * 11/2005 ............... G09F 9/33 |
| DE | 102007015472 10/2008 |

(Continued)

OTHER PUBLICATIONS

Malone et al., "Freeform fabrication of electroactive polymer actuators and electromechanical devices", Mechanical and Aerospace Engineering, Cornell University, Solid Freeform Fabrication Symposium Proceedings, 2004, pp. 1-12.

(Continued)

*Primary Examiner* — Scott B Geyer
*Assistant Examiner* — Alia Sabur
(74) *Attorney, Agent, or Firm* — Allen, Dyer, Doppelt, Milbrath & Gilchrist, P.A.

(57) ABSTRACT

A flexible sheet of organic polymer material, may include a monolithically fabricated array of one or more types of cells juxtaposed among them to form a multi-cell sheet. Each cell may include a self consistent, organic base integrated circuit, replicated in each cell of same type of the array, and shares, in common with other cells of same type, at least a conductor layer of either an electrical supply rail of the integrated circuit or of an input/output of the integrated circuit. A piece of the multi-cell, sheet including any number of self consistent integrated circuit cells, may be severed from the multi-cell sheet by cutting the sheet along intercell bound- (Continued)

aries or straight lines, with a reduced affect on the operability of any cell spared by the cutting.

16 Claims, 6 Drawing Sheets

(56) References Cited

U.S. PATENT DOCUMENTS

| | | | |
|---|---|---|---|
| 6,475,639 B2 | 11/2002 | Shahinpoor et al. | |
| 6,734,370 B2 | 5/2004 | Yamaguchi et al. | |
| 6,924,164 B2 | 8/2005 | Jenson | |
| 7,195,950 B2 | 3/2007 | Taussig | |
| 7,288,340 B2 | 10/2007 | Iwamoto | |
| 7,838,328 B2 | 11/2010 | Isa | |
| 8,283,657 B2 | 10/2012 | La Rosa et al. | |
| 2003/0121976 A1* | 7/2003 | Ostergard | H04N 1/00307 235/454 |
| 2004/0031966 A1* | 2/2004 | Forrest | H01L 27/30 257/79 |
| 2005/0023975 A1* | 2/2005 | Lee | H01L 27/288 313/512 |
| 2005/0094394 A1* | 5/2005 | Padiyath | H01L 51/5203 362/249.01 |
| 2006/0130894 A1* | 6/2006 | Gui | F21S 9/037 136/263 |
| 2006/0286718 A1 | 12/2006 | Ozaki | |
| 2009/0201042 A1* | 8/2009 | Sellathamby | G09G 3/006 324/754.29 |
| 2010/0148164 A1 | 6/2010 | La Rosa et al. | |
| 2010/0201664 A1* | 8/2010 | Lee | B82Y 10/00 345/207 |

FOREIGN PATENT DOCUMENTS

| | | |
|---|---|---|
| IT | VA2008A000062 | 12/2008 |
| NL | 1031918 | 12/2007 |
| WO | 2009016581 | 2/2009 |

OTHER PUBLICATIONS

Malone et al., "Freeform fabrication of ionomeric polymer-metal composite actuators", Mechanical and Aerospace Engineering, Cornell University, Solid Freeform Fabrication Symposium Proceedings, 2004, pp. 1-19.

* cited by examiner

TAILORABLE FLEXIBLE SHEET OF MONOLITHICALLY FABRICATED ARRAY OF SEPARABLE CELLS EACH COMPRISING A WHOLLY ORGANIC, INTEGRATED CIRCUIT ADAPTED TO PERFORM A SPECIFIC FUNCTION

FIELD OF THE INVENTION

The present disclosure relates in general to all-organic integrated electronic systems.

BACKGROUND OF THE INVENTION

Thin organic film fabrication techniques have led to the realization of wholly organic integrated circuits and transducers. In particular organic semiconductors have been successfully used as active layers in organic thin film transistors (OTFT), in radio frequency identification devices (RFIDs), in large-area flexible displays, and in optoelectronic devices, such as, organic photovoltaic cells. Organic materials configured to change their shape when subjected to an electrical signal or to produce an output signal when subjected to bending, compressive, or tensioning forces have been studied. Among these kinds of "organic smart materials," electro-active polymers (EAP) have been extensively investigated and used to make electromechanical devices with sensing and/or actuating capabilities.

Among EAPs, ionic polymer metal composites and conducting polymers have been used for biomimetic sensors, actuators, and artificial muscles. Ionic polymer metal composites (IPMCs) generally include a thin polymeric membrane having a thickness of about 200 µm, coated, generally by an electroplating process, with noble metal electrodes, most usually with platinum, with a thickness of 5-10 µm. When a voltage is applied, to these electrodes, the IPMC bends, while, when a displacement is applied, a voltage is measured from the electrodes.

U.S. Pat. No. 6,475,639, entitled "Ionic polymer sensors and actuators", to Shahinpoor et al. describes methods of making the same for applications requiring sensing, actuating, and displacement control. In this case, the devices are formed by using IPMCs that are polymer metal composites. Therefore the devices may be characterized by a metallic coating of the membrane, forming at least one electrode.

Malone et al. (See, for example, "Freeform Fabrication of Ionomeric Polymer-Metal Composite Actuators," and Freeform Fabrication of Electroactive Polymer Actuators and Electromechanical Devices") explored the possibility of using IPMC and conducting polymers as active materials to freeform fabricate actuators. (See, for example, "Freeform Fabrication of Ionomeric Polymer-Metal Composite Actuators," and Freeform Fabrication of Electroactive Polymer Actuators and Electromechanical Devices"). Strips of constant pressure (CP) actuators were synthesized through electropolymerization from a liquid electrolyte including the monomer by growing the polymer film starting from a dispersion thereof. In particular, polypyrrole (Sigma-Aldrich), and PEDOT/PSS (Sigma-Aldrich) dispersion in liquid electrolyte were investigated. Moreover, to obtain air-operable actuators, either an ion exchange polymer based membrane as "solid polymer electrolyte" (SPE), which is normally hydrated to allow ion migration therethrough, or a liquid electrolyte confined by some kind of diaphragm was used.

On another account, thin-film and printed batteries with their customizable shapes, flexible form factors, and ultra-low weight are enabling new functionality to be added to a broad range of electronic products, such as, smart cards, RFIDs, and sensors, both increasing their usefulness and the size of their addressable markets.

For these reasons many companies are investing in printable batteries and photovoltaic research. Varta AG of Hanover, Germany has developed a 3V extremely flat lithium-polymer primary cell for use in smart cards. It is embedded in a plastic card with thickness of 0.4 mm and provides a capacity of 25 mAh. Solicore. Inc. of Lakeland, Fla. has also developed an ultra-thin flexible lithium-polymer battery (Flexion), giving a nominal voltage of 3V and a capacity of 10 mAh up to 50 mAh and a thickness between 0.37 mm and 0.45 mm.

In Italian patent application No. VA2008A000062, by the present applicant, a sensor and/or actuator system in which functional circuitry is embedded in an all organic electromechanical transducer device ($IP^2C$) is disclosed. The electromechanical transducer device exploits the behavior of a flexible sensible ionomeric material sheet as an effective sensing or actuating member sandwiched between flexible organic electrodes when undergoing a deformation or being polarized at a certain drive voltage applied to the electrodes, respectively.

SUMMARY OF THE INVENTION

In studying and developing autonomous functional devices having embedded powering means or powering devices and means or devices for communicating with the external world, and techniques for to fabricating all-organic integrated circuits, the applicant found a flexible sheet of organic polymeric material, having a finite or theoretically unlimited length, including a monolithically fabricated array of one or more types of side-by-side juxtaposed self-consistent cells.

The multi-cell flexible sheet is configured to be cut into pieces of any desired shape and size, made up by any number of individual cells that compose the flexible sheet as manufactured. A piece of the multi-cell flexible sheet may be severable along intercell boundaries or along straight cut lines, and it may be bent to conform to uneven surfaces that may even flutter or change in time with a structure of any kind of material. Pieces of the flexible sheet may be patched over any support.

Basically, each cell may be self-consistent including an individually operable integrated circuit and transducer element capable of performing a certain function and powering means or device that may include a photovoltaic element and an energy storing element. The self-consistency of each individual cell of the multicell (cellular) flexible sheet may make it possible to cut off even a single cell from the multi-cell sheet for using it as a fully operative unit (the flexible multi-cell sheet as manufactured may provide a magazine of severable self consistent functional units). More important is the fact that the whole sheet or a tailored portion severed from it may be useful for applications requiring a generally large-area "pixel-like" array of independently functioning cells.

The cells forming the flexible sheet as manufactured may all be a replica of the same integrated system. For example, for applications of large-area flexible displays, the cells may comprise optoelectronic devices based on organic light emitting diodes (OLED), or for large area surface profile morphing or pressure distribution mapping, the cells may comprise an organic electro-mechanical actuator or sensor. The multi-cell sheet may even be made of two or more different types of cells, replicated all across the flexible sheet according to a certain pre-established pattern, and configured to provide for the replication of multiple functionalities across the whole area of a tailored piece of the multi-cell sheet.

The shape of the cells may be of any geometric shape: polygonal, disc-like, oblong, etc. Preferably, cell shapes and arrangements should be chosen to provide an increased packing degree of the active areas of the single cells. The size of the cells may be as small as allowed by the definition limits of the printing techniques used in the fabrication process, and as large as desirable for the contemplated application of the multi-cell sheet. Each cell may share, in common with all other cells or at least with all the cells of the same type, at least a conducting layer of the flexible multilayered organic sheet forming an electrical supply rail or an input/output of the integrated circuit of the cells, allowing cells to function in parallel.

Preferably, all the cells share two conducting layers at the front side and at the rear side of the sheet, respectively, forming common power supply rails to which every energy storage element of the elementary cells is coupled in parallel. This permits the eventual or optional powering of the cells with a unified external source besides obviating accidental failure of embedded self powering means or devices of one or more cells.

The materials used for fabricating the multi-cell sheet are mostly organic though inorganic materials, like metals, may also be used. In any case, materials used should be compatible with the fundamentally flexible sheet application. NAFION and KAPTON are examples of commercial materials for the substrate or backbone layers, and gold and PEDOT for electrodes and connections. It is desirable that the materials be compatible with flexible, organic base, integrated electronics fabrication techniques, such as, screen printing, flexography, gravure printing, inkjet printing, and non conventional lithography, like Nano Imprint Lithography (NIL) and Soft Lithography (SL), for example.

Biocompatibility of the component materials may be a requisite for many applications of the multi-cell sheet. Lamination may be used for applying front and rear encapsulating layers of flexible transparent polymeric material.

The sequence of fabrication steps build up a multilayered organic stack over a rear sealing layer of PET/PEN constituting the substrate. Each structured layer is formed in sequence through a number of processing steps, e.g.: deposition of the layer material, imprinting, and etching, according to common practices in fabricating organic base integrated circuit devices. Italian patent application No. VA2008A000062, by the present applicant includes descriptions of several known fabrication techniques for fabricating all-organic integrated circuit devices.

The peculiarities of the article of manufacture of the present disclosure will be illustrated in more detail in the following description making reference to the drawings annexed to this specification.

DETAILED DESCRIPTION OF THE PREFERRED EMBODIMENTS

Figures 1, 2:
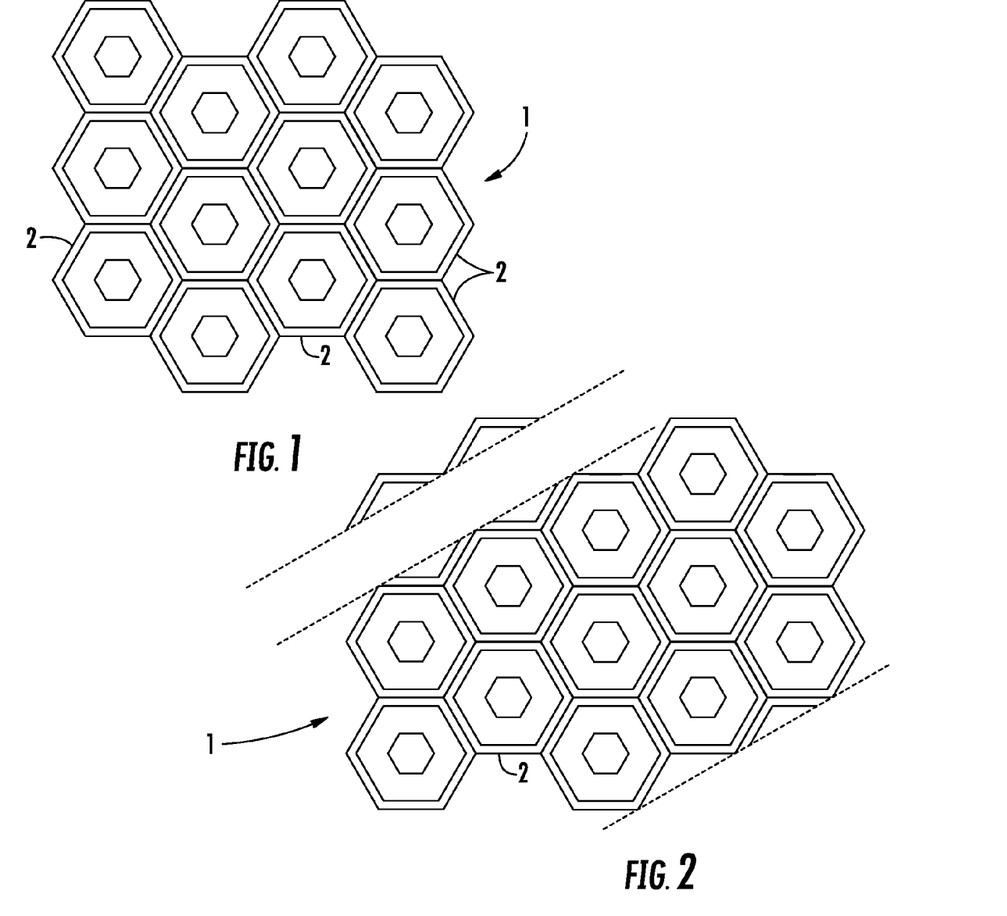
FIG. 1 is a plan view of a fragment of a monolithically fabricated flexible sheet of polymeric organic material in accordance with the present invention.
FIGS. 2 and 3 show possible severing lines of a piece of the multi-cell sheet.

FIG. 1 is an exemplary layout view of a fragment 1 of twelve similar cells that make up a monolithically fabricated flexible sheet of polymeric organic material.

Figure 3:
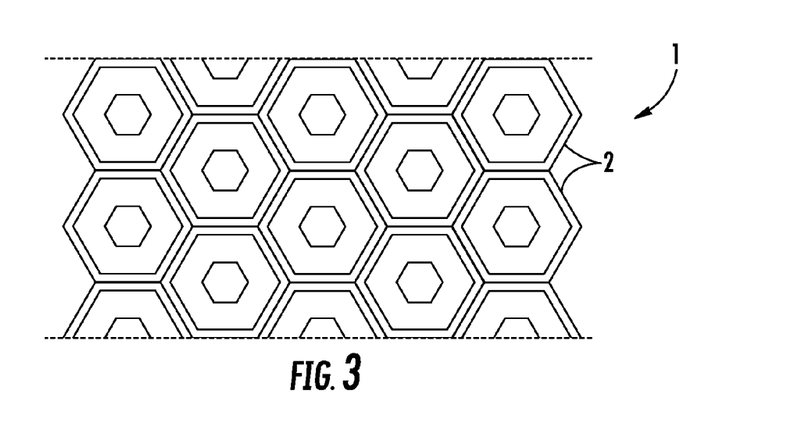
Figure 4:
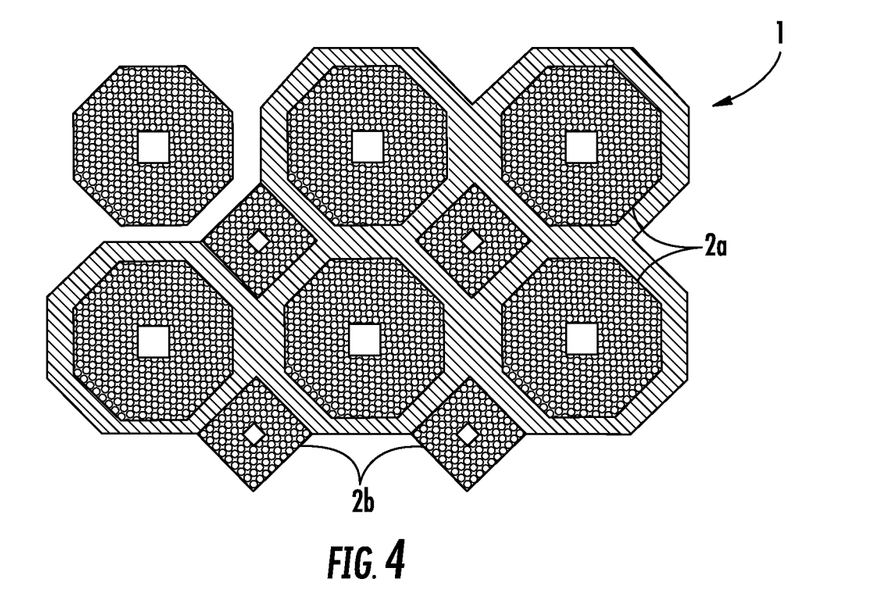
FIG. 4 shows another plan view of a fragment of a multicellular flexible sheet of polymeric organic material in accordance with the present invention.

From a multi-cell flexible sheet of theoretically unlimited size pieces of the desired size, a certain number of individual cells 2 can be severed off by simply cutting the sheet along severing lines as those exemplarily shown in FIGS. 2 and 3. Of course it may also possible to sever a single cell 2 or a fragment composed of a given number of adjacent cells by cutting along the boundary lines among the cells. An alternative packing layout of cells of two different types and/or sizes 2a and 2b is illustrated in FIG. 4, showing a fragment of a multi-cell flexible sheet 1 of polymeric organic material of the present disclosure including two types of cells of different sizes.

Figure 5:
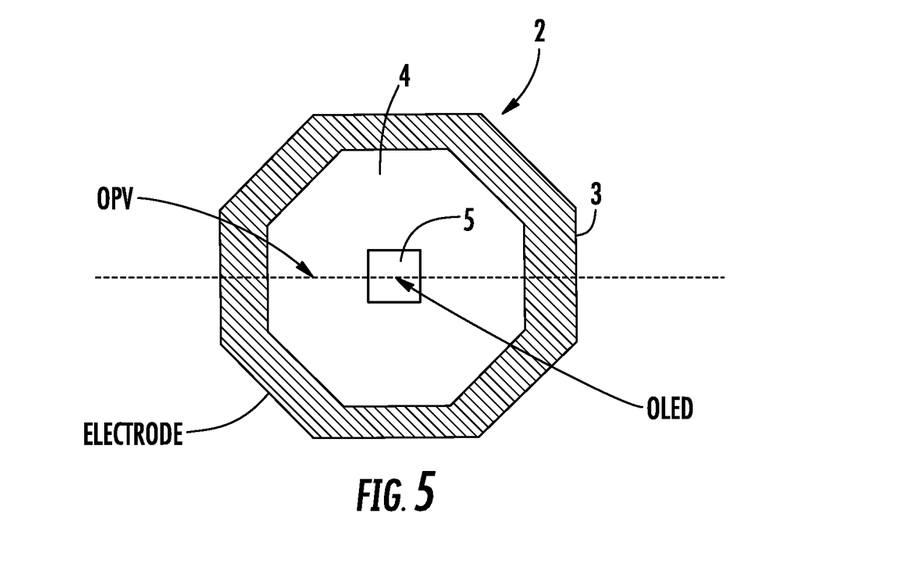
FIG. 5 is a schematic diagram of an elementary integrated circuit cell that is replicated across the flexible sheet of polymeric organic material in accordance with the present invention.
Figure 7:
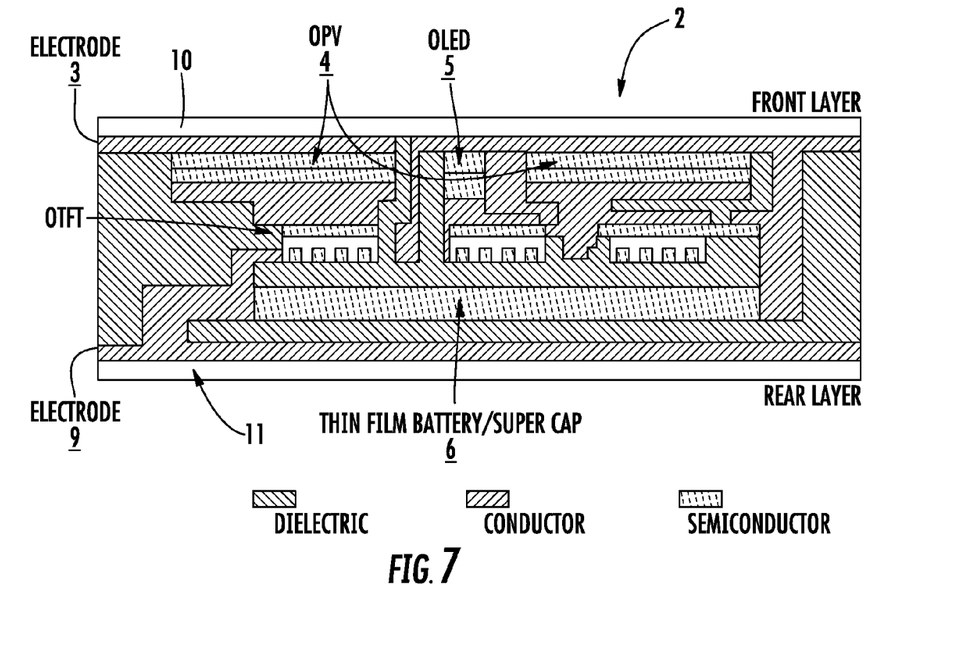
FIG. 7 is a cross-sectional view of basic integrated devices that make up the functional circuit of FIG. 6.

A schematic layout of an elementary integrated circuit cell 2 that is replicated across the flexible sheet of polymeric organic material is illustrated in FIG. 5. Illustratively, the cell has a perimeter strip 3 of a conductive polymer that forms an electrode/pad of the integrated circuit of the elementary cell. The electrode/pad electrically connects to similar electrode/pad conductive polymer layers pertaining to similar cells adjacent to the depicted cell. This provides an electrical connection in parallel of all the cells that include the flexible multi-cell sheet as manufactured. The perimeter strip 3 is in the form of a conductive layer at a front side of sheet and defines a common power supply rail. A second conductive layer 9 is at the rear side of the sheet and defines a second common power supply rail (FIG. 7). The perimeter strip 3 and second conductive layer 9 are coupled in parallel to an energy storage element or device 6.

Figure 6:
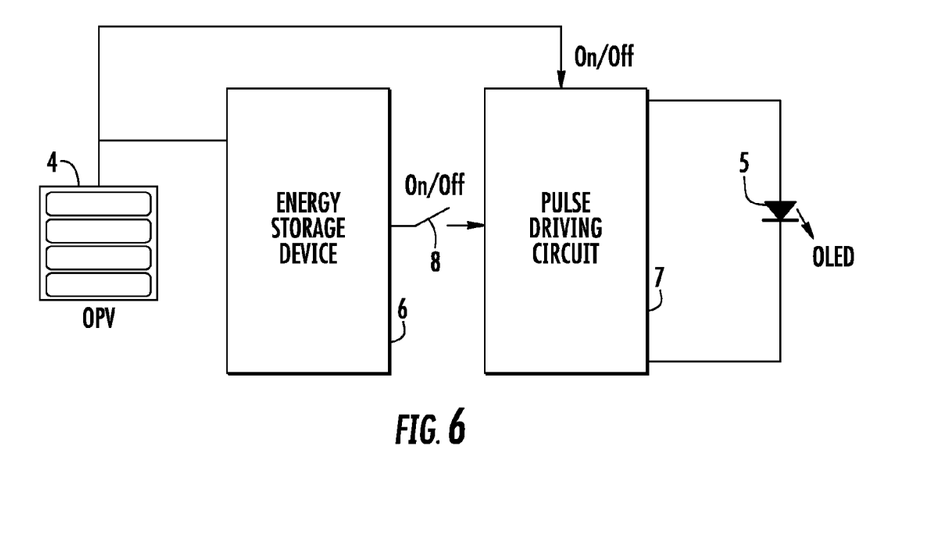
FIG. 6 is a functional block diagram of the integrated circuit of the elementary cell in accordance with the present invention.

The cell includes an organic photovoltaic (OPV) device 4 and an organic light emitting diode (OLED) 5. An exemplary functional block diagram of the integrated circuit of a sample elementary cell is illustrated in FIG. 6. The OPV 4 provides a source of energy and the energy storage device 6 allows the satisfactory powering of the integrated circuit of the cell and of an eventual output transducer or communication device with the external world. Adequate energy storage capability may be provided by a relatively large organic capacitor or by a compatibly integratable thin film battery.

The integrated circuit entirely formed with OTFT, organic resistors and capacitors, manages the energy conversion and storage, and may include, in case of the sample cell considered, a pulse driving circuit 7 for the OLED 5, and even a crepuscular switch 8. Pulsed driving of the OLED may reduce consumption by more than 50%, for example.

A cross-sectional view of the integrated structures of basic integrated devices that form the functional cell circuit of FIG. 6 is shown in FIG. 7. The different shadings illustrate the boundaries of the regions/layers that form the passive and active components of the integrated circuit and of the powering and light emitting devices of the sample cell. The legend at the foot of the drawing gives the general characteristics of the materials of the different regions/layers. The On/Off crepuscolar switch 8 may be implemented by an OTFT controlled by the voltage generated by the OPV, as illustrated in FIG. 7.

Figure 8:
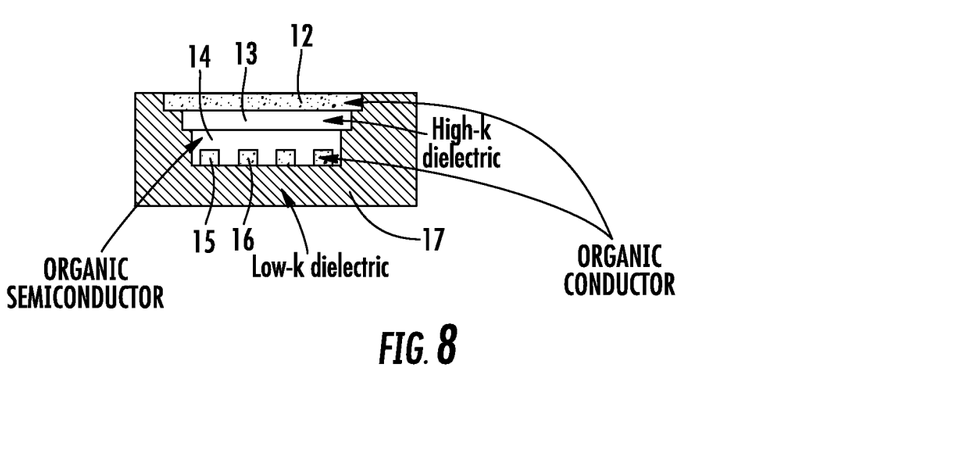
FIG. 8 is a fragmentary cross-sectional view showing the structure of an organic transistor of the structure of FIG. 7.

FIG. 8 is a fragmentary cross-sectional view showing the structure of the organic transistors (OTFT) of the integrated structure of FIG. 7. The integrated transistor structure comprises the conductive gate electrode layer 12 being, for example, gold, the high-k dielectric 13 layer being, for example, PMMA, the organic semiconductor layer 14 being, for example, P3HT (Poly3-HexylThiophene), F8T2, PTAA, or pentacene. The organic semiconductor layer 14 embeds interleaved multi-fingers of source and drain electrodes 15 and 16 of the same organic conductor material with which the gate electrode 12 is made. The low-k dielectric material 17, which may be, for example, Polystyrene Polyimide (PI), isolates the integrated OTFT structure.

Figure 9:
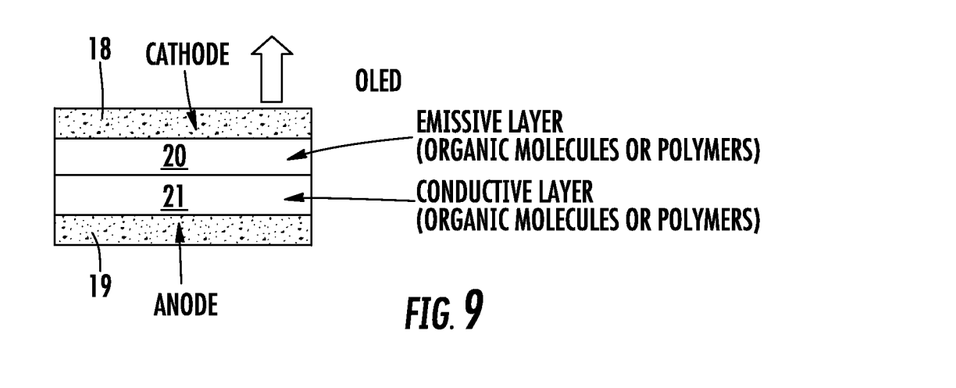
FIG. 9 is a fragmentary cross-sectional view of an organic light emitting diode of the integrated structure of FIG. 7.

FIG. 9 is a fragmentary cross-sectional view of the organic light emitting diode (OLED) of the integrated structure of FIG. 7. The electrode layers 18 and 19 may be of the same conductive material as illustrated in the cross-sectional of the integrated structure of FIG. 7. The conductive anode layer 21 and the emissive cathode layer 20 may be chosen from the commercial family of MERCK's Livilux® products, for example.

Figures 10, 11:
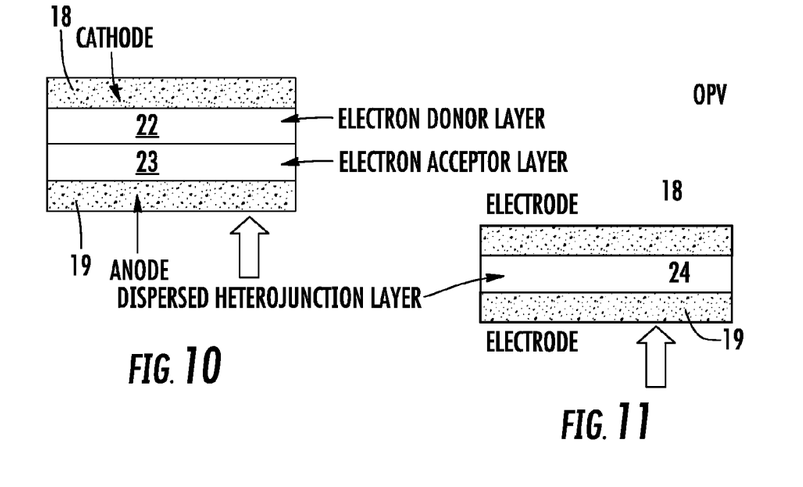
FIGS. 10 and 11 are fragmentary cross-sectional views of alternative structures of the organic photovoltaic device of the integrated structure of FIG. 7.

FIGS. 10 and 11 are fragmentary cross-sectional views of alternative structures of the organic photovoltaic device (OPV) of the integrated structure of FIG. 7. The donor layer 22 may be tri[4-(2-thienyl)phenyl]amine or tris[4-(5-phenylthiophen-2-yl)phenyl]amine. The acceptor layer 23 may be fullerene, and the hetero-junction layer 24 may be SnPc:$C_{60}$.

Figure 12:
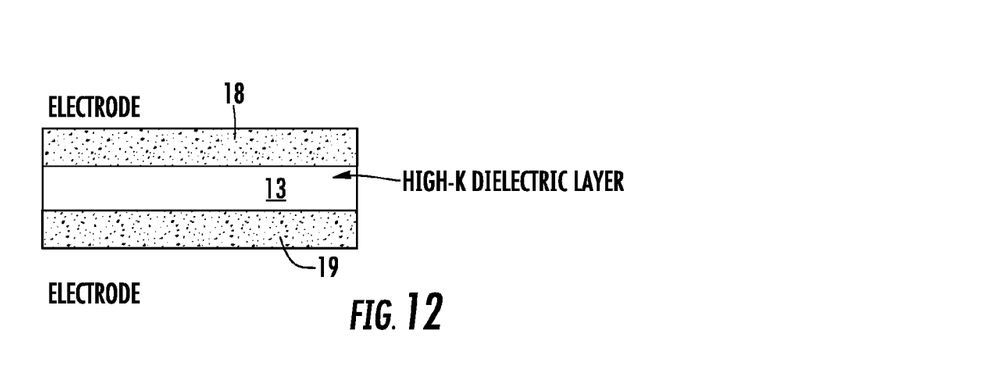
FIG. 12 is a fragmentary cross section of a large size capacitor useful as energy storage element usable in the integrated structure of FIG. 7.
Figure 13:
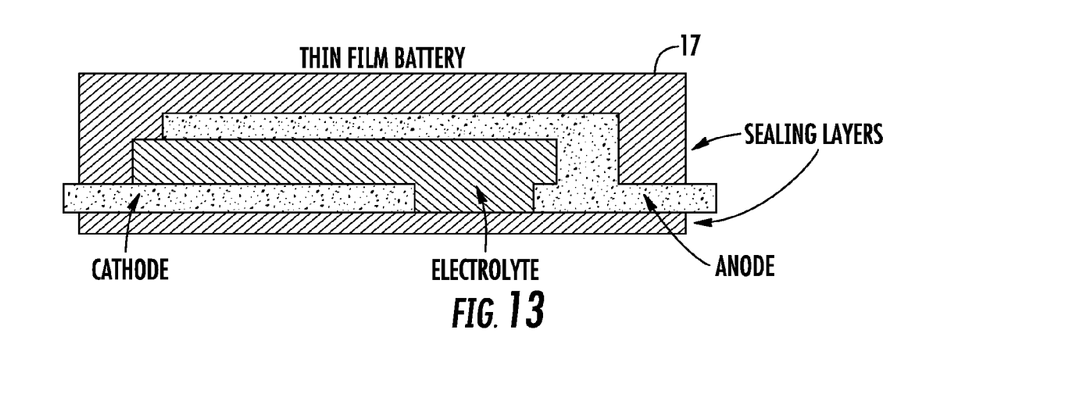
FIG. 13 is a fragmentary cross-sectional view of a thin film battery usable as energy storage element in an integrated structure as the one depicted in FIG. 7.

FIG. 12 is a fragmentary cross section of a large size capacitor useful as energy storage element and usable in the integrated structure of FIG. 7. FIG. 13 is a fragmentary cross-sectional view of a thin film battery usable as an energy storage element in an integrated structure similar to the one depicted in FIG. 7. The encapsulating layer 17 may be PET/PEN, for example.

Figure 14:
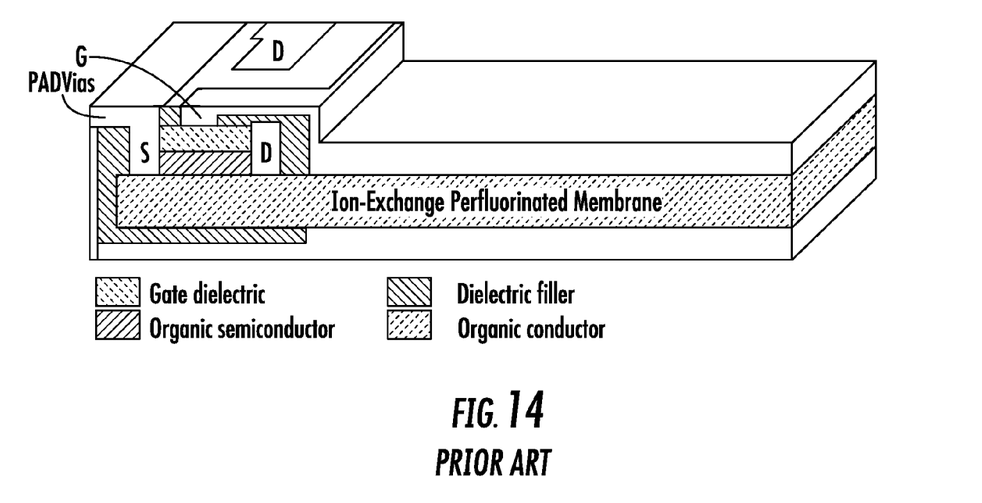
FIG. 14 is a fragmentary partially sectioned integrated structure of an all organic cell including an actuating/positioning/vibrating element as in the prior art.

FIG. 14 is a fragmentary partially sectioned integrated structure of an all organic integrated sensor and/or actuator system in which functional circuitry is embedded in an all organic electromechanical transducer device ($IP^2C$), as disclosed in Italian patent application no. VA2008A000062, the entire contents of which are herein incorporated by reference. As described in the above noted application, the electromechanical transducer device exploits the behavior of a flexible sensible ionomeric material sheet as an effective sensing or actuating member sandwiched between flexible organic electrodes when undergoing a deformation or being polarized at a certain drive voltage applied to counter electrodes of the device.

The integrated system may be replicated in each cell of the monolithically fabricated flexible multi-cell sheet of the present embodiments, eventually along with an OPV front element for recharging an embedded micro battery, to provide for different useful functionalities of the tailorable flexible multi-cell sheet. For example, the sheet may be useful as a pressure distribution mapping device over large surfaces, or as a light operated large area profile actuator.

Figure 15:
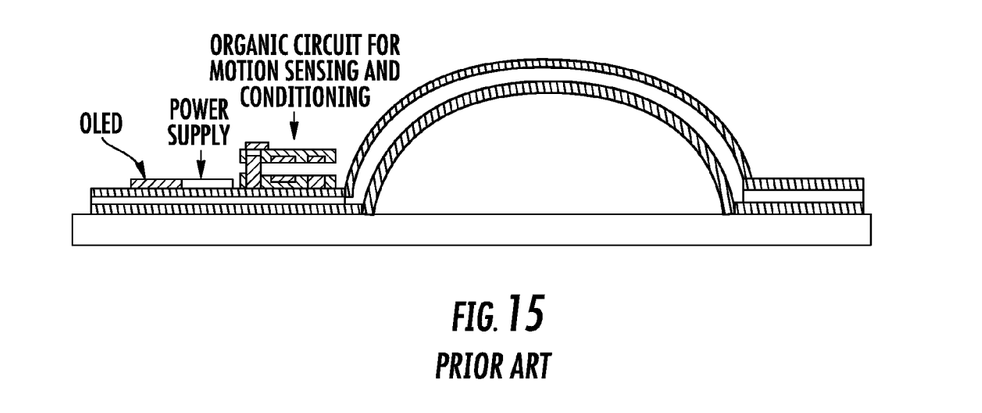
FIG. 15 is a fragmentary simplified cross-sectional view of an integrated motion/pressure sensing device as in the prior art and configured to be included in an cell of the present embodiments.

FIG. 15 is a fragmentary simplified cross-sectional view of an integrated motion/pressure sensing device as disclosed and illustrated in FIG. 5 of Italian patent application no. VA2008A000062, that is also configured to be included in an elementary cell of the flexible multi-cell sheet of the present embodiments, eventually along with an OPV front element for recharging an embedded micro battery, to provide for yet different useful functionalities of the tailorable flexible multi-cell sheet.

That which is claimed:

1. A method of making an article comprising:
    forming a flexible multi-layered sheet, comprising an organic polymer material, by at least
        forming an array of at least one type of organic integrated circuit (IC) cells in side-by-side relation, with each organic IC cell comprising an organic base IC energy storage element, and front and rear common conducting layers on opposing sides of the organic base IC energy storage element, the front and rear common conducting layers being coupled in parallel with the organic base IC energy storage element and shared with other cells of the same type to define common power supply lines, the front common conducting layer comprising a conductive polymer perimeter strip carried along a perimeter of the organic IC cell to electrically couple adjacent ones of the organic IC cells, each organic IC cell further comprising an organic light emitting diode (OLED) and an organic photovoltaic device (OPV), the OLED being spaced from the conductive polymer perimeter strip by the OPV,
        the array being formed to include a number of cells to be removable therefrom so that cells that remain after removing are operable irrespective of whether the removal occurred at an intercell boundary among the cells and so that each operable cell that remains is bordered by a plurality of operable cells after removing.

2. The method of claim 1, wherein forming the array comprises forming the array as a monolithic unit.

3. The method of claim 1, wherein forming the array comprises forming the array so the number of cells being removable is removable by cutting the flexible multi-layered sheet along at least one intercell boundary.

4. The method of claim 1, wherein forming the array comprises forming the array so the number of cells being removable is removable by cutting the flexible multi-layered sheet along straight lines.

5. The method of claim 4, wherein forming each organic IC cell further comprises forming a light sensitive switch to be coupled to the OPV.

6. The method of claim 1, wherein forming each organic IC cell further comprises forming at least one integrated organic thin film transistor (OTFT).

7. A method of making an article comprising:
forming a flexible multi-layered sheet, comprising an organic polymer material, into an array of cells in side-by-side relation, with each cell comprising an organic base integrated circuit (IC) energy storage element and front and rear common conducting layers on opposing sides of each cell, the front and rear common conducting layers being coupled in parallel with the organic base IC energy storage element and shared with other cells, and with at least one of the cells being removable so that cells that remain after removing are operable irrespective of whether the removal occurred at an intercell boundary among the cells and so that each operable cell that remains is bordered by a plurality of operable cells after removing, the front common conducting layer comprising a conductive polymer perimeter strip carried along a perimeter of the cell to electrically couple adjacent ones of the cells, and each cell further comprising an organic light emitting diode (OLED) and an organic photovoltaic device (OPV), the OLED being spaced from the conductive polymer perimeter strip by the OPV.

8. The method of claim 7, wherein the array is formed as a monolithic unit.

9. The method of claim 7, wherein the array is formed so that the at least one cell being removable is removable by cutting the flexible multi-layered sheet along at least one intercell boundary.

10. The method of claim 7, wherein the array is formed so that the at least one cell being removable is removable by cutting the flexible multi-layered sheet along at least one straight line.

11. The method of claim 10, wherein the flexible multi-layered sheet is formed into the array so that each cell comprises a light sensitive switch to be coupled to the OPV.

12. The method of claim 7, wherein the flexible multi-layered sheet is formed into the array so that each cell comprises at least one integrated organic thin film transistor (OTFT).

13. A method of making an article comprising:
forming a flexible sheet into an array of cells, with each cell comprising an organic base integrated circuit (IC) energy storage element and front and rear common conducting layers on opposing sides of the cell, the front and rear common conducting layers being coupled in parallel with the organic base IC energy storage element and shared with other cells, and with at least one of the cells being removable so that cells that remain after removing are operable irrespective of whether the removal occurred at an intercell boundary among the cells and so that each operable cell that remains is bordered by a plurality of operable cells after removing, the front common conducting layer comprising a conductive polymer perimeter strip carried along the perimeter of the cell to electrically couple adjacent ones of the cells, each organic IC cell further comprising an organic light emitting diode (OLED) and an organic photovoltaic device (OPV), the OLED being spaced from the conductive polymer perimeter strip by the OPV.

14. The method of claim 13, wherein the array is formed as a monolithic unit.

15. The method of claim 13, wherein the array is formed so that the at least one cell being removable is removable by cutting the flexible multi-layered sheet along at least one intercell boundary.

16. The method of claim 13, wherein the array is formed so that the at least one cell being removable is removable by cutting the flexible multi-layered sheet along at least one straight line.

* * * * *